United States Patent [19]

Urbish et al.

[11] Patent Number: 4,894,663

[45] Date of Patent: Jan. 16, 1990

[54] ULTRA THIN RADIO HOUSING WITH INTEGRAL ANTENNA

[75] Inventors: Glenn F. Urbish, Coral Springs; Quirino Balzano, Plantation; Dale W. Dorinski, Coral Springs; Martin J. McKinley; Leng H. Ooi, both of Sunrise; John A. Stoutland, Margate; Anthony B. Suppelsa, Coral Springs, all of Fla.

[73] Assignee: Motorola, Inc., Schaumburg, Ill.

[21] Appl. No.: 121,322

[22] Filed: Nov. 16, 1987

[51] Int. Cl.[4] ............................................. H01Q 1/24
[52] U.S. Cl. .................................. 343/702; 343/881; 455/351; 361/398
[58] Field of Search ....................... 343/702, 881, 748; 455/351, 89, 90; 361/398

[56] References Cited

U.S. PATENT DOCUMENTS

| | | | |
|---|---|---|---|
| 3,736,591 | 5/1973 | Rennels et al. | 343/702 |
| 3,956,701 | 5/1976 | James, Jr. et al. | 455/351 |
| 4,004,228 | 1/1977 | Mullett | 343/702 |
| 4,123,756 | 10/1978 | Nagata et al. | 343/702 |
| 4,648,125 | 3/1987 | Brown | 455/351 |

FOREIGN PATENT DOCUMENTS

| | | | |
|---|---|---|---|
| 0139358 | 10/1979 | Japan | 343/702 |
| 0047522 | 3/1985 | Japan | 455/351 |

Primary Examiner—Rolf Hille
Assistant Examiner—Doris J. Johnson
Attorney, Agent, or Firm—Daniel K. Nichols; Martin J. McKinley

[57] ABSTRACT

The preferred housing includes an integrally molded thermoplastic base (102) and cover (104) assembly. The cover is joined to the base by a living hinge (106) and a peripheral wall (108) extends around the perimeter of the base. In one embodiment, the antenna is a wire loop (204), the wire being wound in an external circumferential groove (202A) in the peripheral wall or, alternatively, integrally molded into the peripheral wall. Other embodiments use printed circuit loop antenna patterns that are preferably vacuum deposited directly onto the thermoplastic base and/or cover. When the antenna pattern is disposed on both the cover and the base, a portion of the antenna (e.g., 1002K) is also disposed on the hinge to join the main portions of the antenna on the base and cover. In one embodiment of the printed circuit loop antenna, the plane of the loop lies parallel to the base and may include one or more turns or loops (e.g., 402C, E, G and J). In another embodiment, the loop includes a 90 degree bend (e.g., 504) and both planes of the loop lie perpendicular to the base. In still another embodiment, the loop includes three 90 degree bends, a crossover at one of the bends (e.g., at 704), and all four planes of the loop lie perpendicular to the base.

13 Claims, 5 Drawing Sheets

ULTRA THIN RADIO HOUSING WITH INTEGRAL ANTENNA

BACKGROUND OF THE INVENTION

This invention pertains to housings for radios and more particularly to a thin, portable radio housing with an integral antenna.

An ultra thin electronic apparatus housing may be described as a housing having a thickness approximately equal to the thickness of several plastic credit cards, more or less. (A typical plastic credit card is slightly less than one millimeter thick.) These housings frequently have a length and width similar to a plastic credit card and, consequently, are often referred to as "credit card housings". The primary application for ultra thin housings has been in the pocket calculator art and U.S. Pat. No. 4,558,427 to Takeuchi et al. Describes and illustrates a housing suitable for a "credit card calculator".

There are other applications for ultra thin housings; for example, it would be desirable to have a selective call radio paging receiver (commonly called a "pager") contained within an ultra thin housing. Other radio receivers have already been integrated into ultra thin housings. In particular, the Casio Corporation, the assignee of the Takeuchi et al. patent, has manufactured a "credit card FM radio" (model RD-10) that receives commercial radio FM broadcasts. To hear a broadcast, the user wears a small earphone which is connected to the RD-10 by a cable. The earphone cable also functions as an antenna. Unfortunately, selective call radio paging receivers are not usually equipped with earphones. Thus, if a selective call paging receiver is to be integrated into an ultra thin housing ("a credit card pager") an integral antenna is necessary.

Because of its small size, it is anticipated that a credit card pager would be frequently carried very close to the body of the user; for example, in a shirt pocket. This presents a problem for an antenna that is positioned either on or within the ultra thin housing. Since the body is a good conductor, the electric field component of a received radio transmission is substantially shorted out near the surface of the body. This appears to eliminate electric field antennas, such as dipole antennas, as a suitable choice for a credit card pager.

The magnetic field component of a received radio transmission, however, is not shorted out close to the body and the lines of magnetic flux run parallel to the surface of the body. This seems to indicate that magnetic field antennas would be suitable for credit card pagers. However, there are two requirements that conflict when one attempts to position a magnetic loop antenna within an ultra thin housing; specifically, the cross-sectional area of a magnetic loop antenna should be as large as possible (more specifically, when the size of the loop antenna is less than half a wavelength) and the cross-sectional area of the loop (i.e., the "plane" of the loop) should be positioned perpendicular to the lines of magnetic flux. Since there are dramatic differences in the three dimensions of an ultra thin housing (length, width and depth; depth being extremely small) the antenna should be positioned parallel to the base and cover (i.e., parallel to length and width) to achieve maximum area. But this positions the loop parallel to the lines of magnetic flux, not perpendicular as required. If the loop is positioned perpendicular to the base or cover (i.e., perpendicular to length and width) the cross sectional area of the loop is very small. Thus, upon further analysis, it appears that a magnetic field loop antenna is also unsuitable for a credit card pager.

Experiments performed by the applicants, however, have indicated that a loop antenna positioned parallel to the base or cover of an ultra thin housing yields satisfactory performance when the housing is positioned close to the body. Applicants theorize that because the body is slightly curved and the housing is flat, the base of the housing can only be positioned parallel to the body at one point. Thus, the loop antenna is not positioned perfectly parallel to the lines of the magnetic flux, but at an acute, non-zero angle which permits the antenna to function.

SUMMARY OF THE INVENTION

Briefly, the invention is an ultra thin radio housing with an integral antenna that includes a thin base having a flat surface. The thin base includes a peripheral wall attached to the flat surface of the base and extending substantially around the perimeter of the base. A loop antenna is disposed on the base near the perimeter of the base.

BRIEF DESCRIPTION OF THE DRAWINGS

In all figures that illustrate both the base and cover of the housing, whether perspective or plan view, the housing is illustrate "opened up" (i.e., unassembled), such that the interior surface of the housing cover faces up in the figure.

DESCRIPTION OF THE PREFERRED EMBODIMENT

Figure 1:
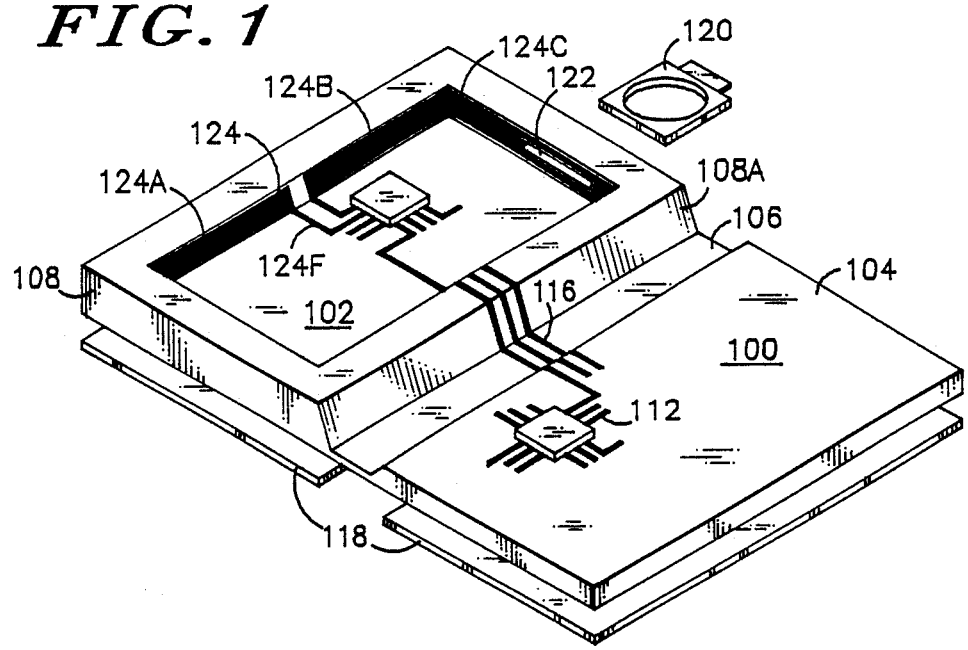
FIG. 1 is a perspective view of an ultra thin radio housing with a printed circuit loop antenna disposed on the interior surface of the peripheral wall.

FIG. 1 illustrates the preferred housing for the present invention. This housing is described in a co-pending application entitled "Moldable/Foldable Radio Housing" that was filed on the same day as the present application and which is wholly incorporated by reference herein. Briefly, the preferred housing 100 includes a thin base 102 and a thin cover 104 which are joined by a "living hinge" 106. Base 102 has exterior and interior opposed flat surfaces and includes a peripheral wall 108 attached to the interior surface of the base (the upper surface in the figure) and extending around the perimeter of the base. The peripheral wall 108 has exterior, upper and interior surfaces and the exterior surface 108A adjacent hinge 106 slopes at an acute angle relative to the interior surface of the base. Base 102 (including peripheral wall 108), cover 104 and hinge 106 are preferably integrally molded from a thermoplastic material. Although the rectangular parallelepiped shape of the housing illustrated in FIG. 1 is preferred, other shapes may also be suitable, for example, the housing could be shaped as an ultra thin cylinder (i.e., "coin" shaped).

In all figures wherein base 102 and cover 104 are illustrated, whether perspective or plan view, the housing is shown unassembled. To complete assembly, cover 104 is rotated about hinge 106 until the interior surface of the cover (the upper surface in the figure) contacts the upper surface of peripheral wall 108, whereupon it is preferably ultrasonically welded in place.

Two printed circuit patterns 110 and 112 are disposed on the interior surfaces of base 102 and cover 104, and electronic radio components, for example 114, are soldered to these patterns. An interconnecting printed circuit pattern 116 is disposed on peripheral wall 108 and hinge 106, to interconnect circuit patterns 110 and 112. Printed circuit patterns 110 and 112 may also include conductors on the exterior surfaces of base 102 and cover 104 (the lower surfaces in the figure), respectively, with interconnections between the interior and exterior portions of the circuit patterns being provided by conductive through-holes. If any conductors are disposed on the exterior surfaces of either the base or cover, thin sheets of mylar 118 or other insulative material can be adhesively bonded to the exterior surfaces to provide proper electrical insulation. A battery compartment 120 slides into the housing through a slot 122 in peripheral wall 108. Printed circuit patterns 110, 112 and 116, electronic radio component 114, mylar sheets 118 and battery compartment 120 are not illustrated in FIGS. 2–10, however, some or all of these elements are included in the embodiments of FIGS. 2–10.

Although the above described molded thermoplastic housing is preferred, other more conventional housing constructions may also be suitable, such as Takeuchis' multilayer laminated structure. Interconnections between printed circuit patterns 110 and 112 in conventional housings can be provided by flex circuits, conductive elastomers or other well known interconnection devices. It is preferred, however, that the electronic components should be sufficiently integrated such that the complete radio circuit will fit on the interior surface of base 102, thereby eliminating the need for printed circuit pattern 112 and interconnection 116.

In FIG. 1, a magnetic loop antenna 124 is disposed on the interior surface of peripheral wall 108 and includes five segments (only segments 124A, B and C are visible in FIG. 1) that form a loop, and a short transmission line 124F connects the loop to printed circuit pattern 110. Segment 124C has an opening to admit battery compartment 120. If electronic radio components are mounted on cover 104, then interconnecting conductors 116 may be insulated from antenna 124 by the use of multilayer circuit board manufacturing techniques such as those described in a co-pending application entitled "Multilayer Thermoplastic Printed Circuit Substrate and Method of Manufacture" that was filed on the same date as the present application and which is wholly incorporated by reference herein. As discussed above, however, it is preferred that the radio be sufficiently integrated such that printed circuit patterns 112 and 116 are unnecessary. In the alternative, loop antenna 124 could be disposed on either the upper or exterior surfaces of peripheral wall 108.

All printed circuit patterns, including printed circuit antenna patterns, are preferably formed by vacuum depositing a solderable conductor onto the surfaces of a molded thermoplastic substrate, as described in a co-pending application entitled "High Temperature Thermoplastic Substrate Having A Vacuum Deposited Solderable Electrical Circuit Pattern And Method Of Manufacture" that was filed on the same date as the present application and which is wholly incorporated by reference herein. Other well known methods of applying a conductor to a substrate may also be suitable. For example, a conductor can be electroless plated to the surfaces of a molded substrate. The conductor can then be formed into a printed circuit pattern using the photolithographic techniques described in a co-pending application entitled "Photoimaged Three Dimensional Printed Circuit Substrate and Method of Manufacture" that was filed on the same date as the present application and which is wholly incorporated by reference herein. In the alternative, a conductive printed circuit foil can be adhesively bonded to the substrate.

Figure 2A:
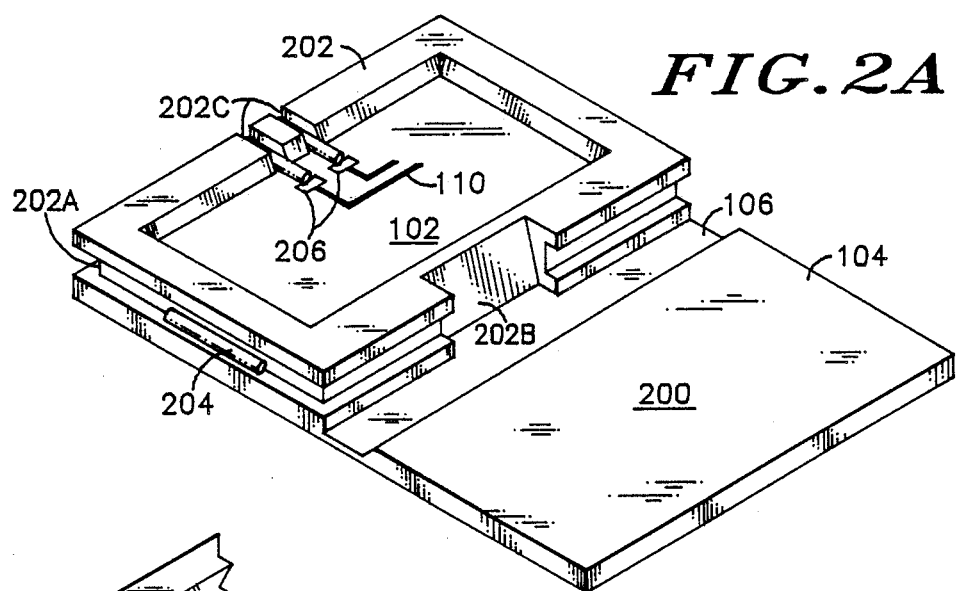
FIG. 2A is a perspective view of an ultra thin radio housing with a wire loop antenna positioned in an external circumferential groove in the peripheral wall.

In FIG. 2A, a wire loop antenna embodiment of the present invention is illustrated. Referring to this figure, the preferred housing 200 is similar in design and construction to housing 100 in that it includes base 102, cover 104, and hinge 106. Peripheral wall 202, however, includes an exterior circumferential groove 202A, a narrow, centrally positioned sloping wall 202B, and one or more slots 202C. A wire loop antenna 204 is wound in groove 202A and may include one or more turns. The ends of wire loop 204 are connected to solder pads 206, which in turn are connected to printed circuit pattern 110. Sloping exterior wall 202B is provided to support interconnecting printed circuit patterns, such as 116 of FIG. 1, and may be eliminated if no printed circuit pattern is provided on cover 104. If housing 200 is relatively thick, groove 202A can be positioned above or below the battery compartment slot, such as slot 122 of FIG. 1. If housing 200 is relatively thin, however, the battery slot and compartment can be eliminated and an internal battery may be utilized.

Figure 2B:
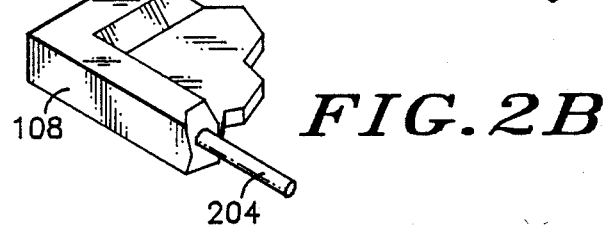
FIG. 2B is a partial perspective view of an alternate embodiment of FIG. 2A, wherein the wire loop antenna is molded within the peripheral wall.

In FIG. 2B, loop antenna 204 is molded into peripheral wall 108, rather than being wound into external circumferential groove 202A.

Figure 3:
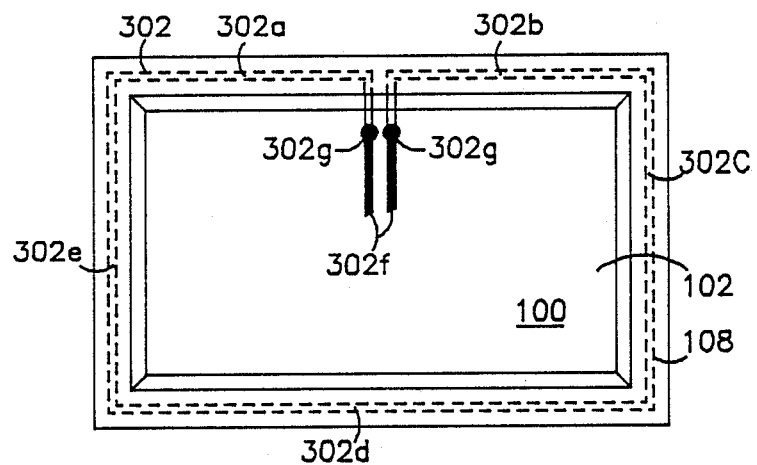
FIG. 3 is a plan view of the base of an ultra thin radio housing with a printed circuit loop antenna disposed on the bottom surface of the base.

In FIG. 3, a printed circuit loop antenna 302 is illustrated. Loop antenna 302 includes segments 302A–E which are disposed on the exterior surface of base 102. Two transmission line conductors 302F are disposed on the interior surface of base 102 and are connected to loop segments 302A and B by conductive through-holes 302G. In the alternative, loop 302 could be disposed on the interior surface of base 102, adjacent peripheral wall 108, or on either the interior or exterior surface of cover 104 (not illustrated in FIG. 3).

Figure 4:
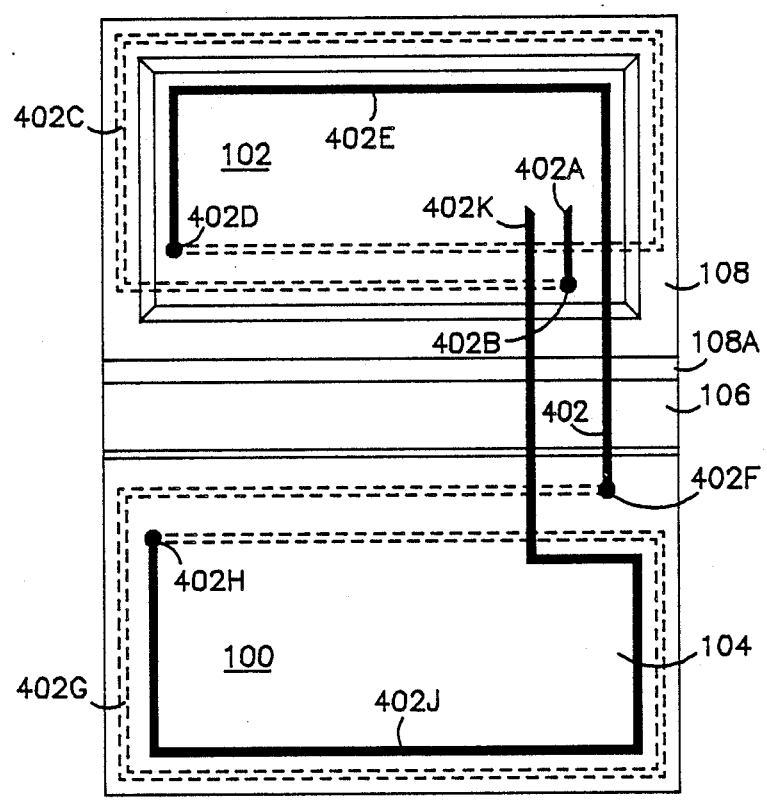
FIG. 4 is a plan view of an ultra thin radio housing with a printed circuit, four-turn, loop antenna disposed on the exterior and interior surfaces of the base and cover.

In FIG. 4, a four turn, printed circuit loop antenna 402 is illustrated. Turns 402C and E are respectively disposed on the exterior and interior surfaces of base 102 while turns 402J and G are respectively disposed on the interior and exterior surfaces of cover 104. Transmission line conductors 402A and K are disposed on the interior surface of base 102 and conductor 402K extends across peripheral wall 108 and hinge 106 onto the interior surface of cover 104. Conductive through-hole 402B connects transmission line conductor 402A to turn 402C, through-hole 402D connects segments 402C and E, through-hole 402F connects turns 402E and G, and through-hole 402H connects turns 402G and J. In the alternative, one or more turns may be eliminated, thereby providing a two or three turn multiloop antenna.

The "plane" of a loop antenna is an imaginery plane that coincides with the loop. In FIG. 3, for example, the plane of loop antenna 302 coincides with segments 302A-E and lies parallel to the interior and exterior flat surfaces of base 102. Similarly, the plane of the loop antennas depicted in FIGS. 1, 2A and B, and 4, also lies parallel to the interior and exterior flat surfaces of base 102.

Figure 5:
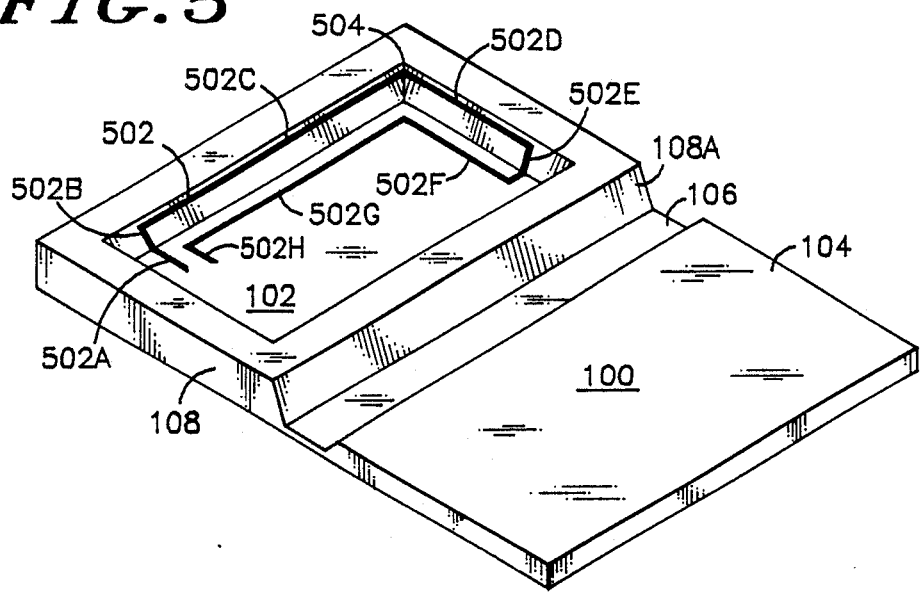
FIG. 5 is a perspective view of an ultra thin radio housing with a printed circuit, single-fold, loop antenna disposed on the base and peripheral wall.

In FIG. 5 a single-fold, printed circuit loop antenna 502 is illustrated. Referring to this figure, segments 502B and C are disposed on an interior surface of the peripheral wall 108 and segments 502D and E are disposed on an adjacent interior surface of the peripheral wall, thereby forming a substantially 90 degree bend in the antenna at corner 504. Upper segments 502C and D are preferably disposed as far from the interior surface of base 102 as possible. Segment 502E interconnects the upper segments 502C and D to the lower segments 502F and G, which are preferably disposed on the interior surface of base 102 near peripheral wall 108. In the alternative, segments 502F and G may be disposed on the interior surface of peripheral wall 108 as close to the interior surface of base 102 as possible. Transmission line segments 502A and H interconnect antenna 502 to the printed circuit pattern (not illustrated in FIG. 5) on the interior surface of base 102.

Figure 6:
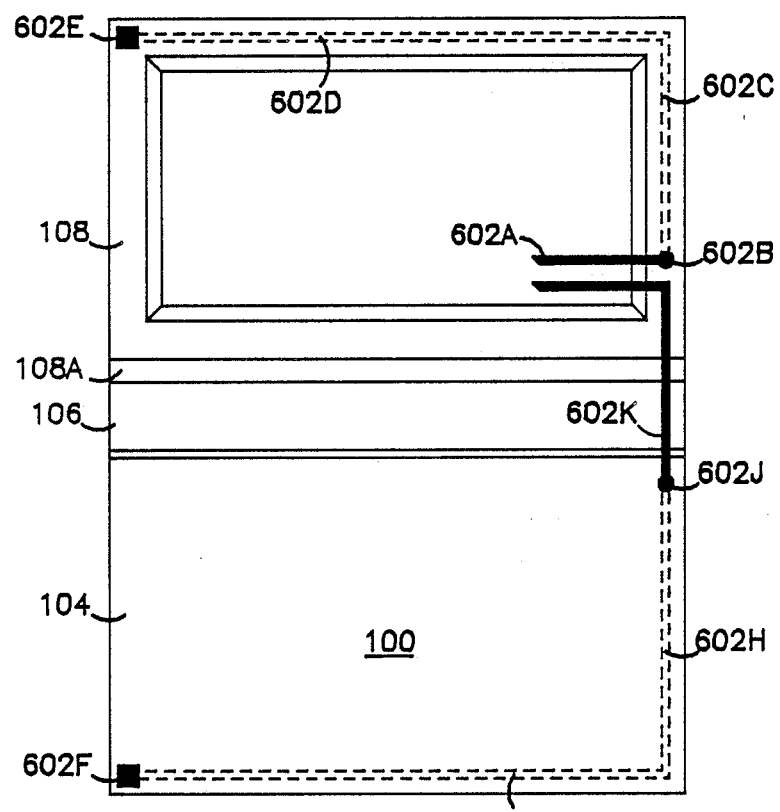
FIG. 6 is a plan view of an ultra thin radio housing with a printed circuit, single-fold, loop antenna disposed on the exterior surfaces of the base and cover.

In FIG. 6, another embodiment of the single-fold printed circuit loop antenna is illustrated. When housing 100 is fully assembled by folding cover 104 over base 102, antenna 602 is similar in shape to antenna 502 of FIG. 5, but has a larger cross-sectional area because the segments of the antenna are disposed on the exterior surfaces of the base and cover. Specifically, segments 602C and D are disposed on the exterior surface of base 102 while segments 602G and H are disposed on the exterior surface of cover 104. Transmission line conductor 602A is disposed on the interior surface of base 102 and is connected to segment 602C via conductive through-hole 602B. Transmission line conductor 602K is disposed on the interior surface of base 102, peripheral wall 108, hinge 106 and the interior surface of cover 104, and is connected to segment 602H via conductive through-hole 602J. A conductive through-hole 602E is connected to segment 602D and includes a soldering pad on the upper surface of peripheral wall 108. Similarly, a conductive through-hole 602F is connected to segment 602G and includes a soldering pad on the interior surface of cover 104. Solder is dispensed onto one or both of the soldering pad surfaces of 602E and F. These two pad surfaces come into contact when housing 100 is assembled by folding cover 104 over base 102) and the solder is reflowed by conducting heat to the exterior surfaces of conductive through-holes 602E and F. The soldering pad portions of 602E and F are preferably recessed into housing 100 such that their surfaces are flush with the adjacent surface of the housing.

The segments of the loop antennas illustrated in FIGS. 1–4 define a single plane. In FIGS. 5 and 6, however, loop antennas 502 and 602 define two distinct planes. Referring to FIG. 5, the first plane is defined by segments 502C and 502G, while the second plane is defined by segments 502D and 502F. Although these two planes are at right angles to each other, either plane is substantially perpendicular to the flat interior surface of base 102. As discussed above, the shape of antenna 602 is similar to the shape of antenna 502 and, therefore, either plane of loop antenna 602 is also substantially perpendicular to the flat interior surface of base 102.

Figure 7:
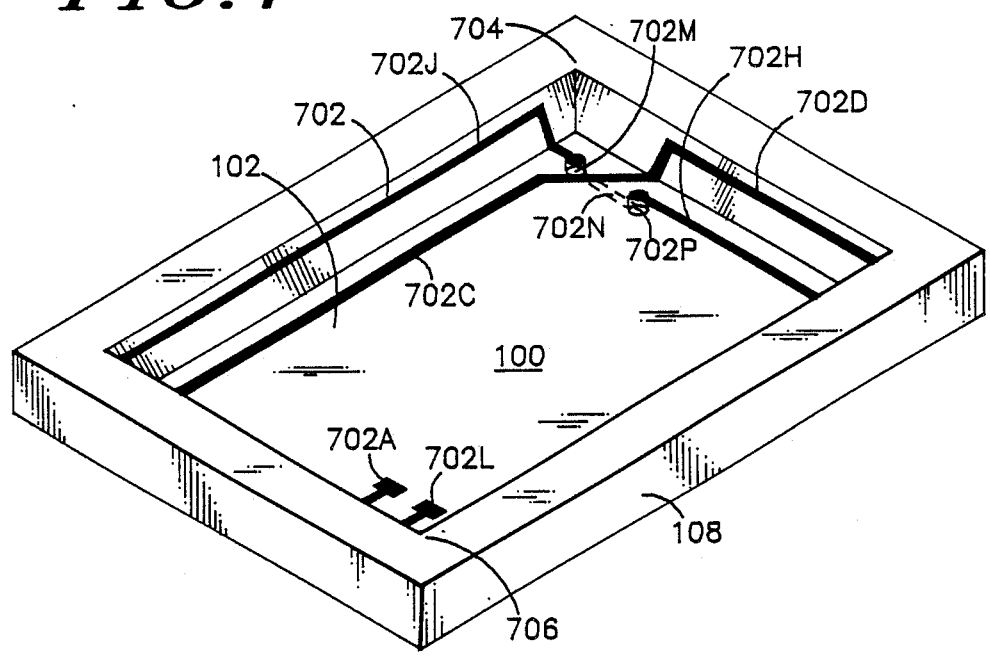
FIG. 7 is a perspective view of an ultra thin radio housing with a printed circuit, triple-fold, single-crossover, loop antenna disposed on the base and peripheral wall.
Figure 8:
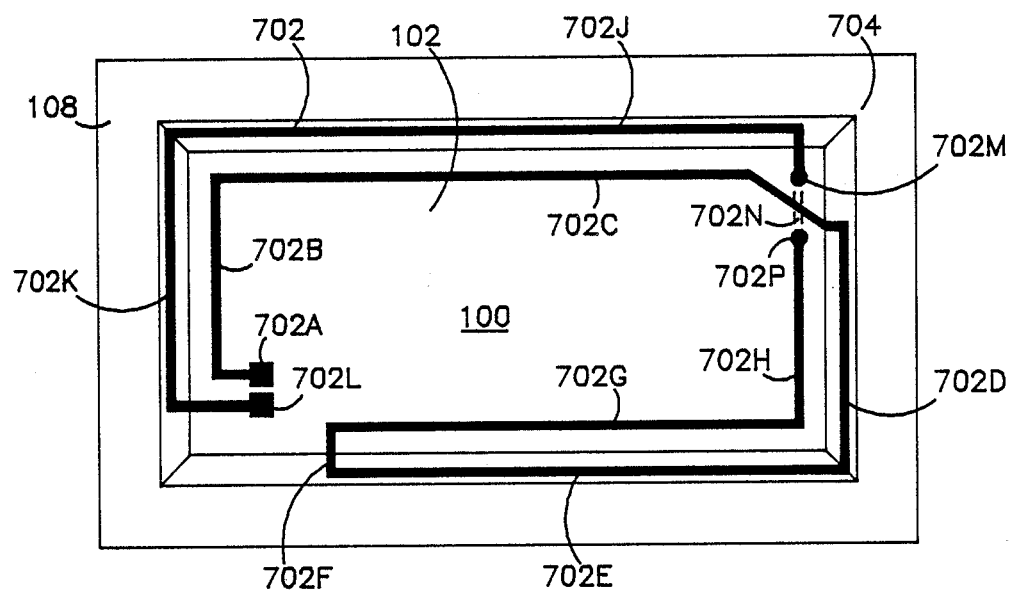
FIG. 8 is a plan view of FIG. 7.

In FIGS. 7 and 8, a triple-fold, single crossover, printed circuit loop antenna is illustrated. Referring to these figures, lower segments 702B, C, H and G, are preferably disposed on the interior surface of base 102 adjacent peripheral wall 108. Upper segments 702K, J, D and E are disposed on the interior surface of peripheral wall 108, farthest from the interior surface of base 102. Transmission line segments 702A and L are disposed on the interior surface of base 102 and are connected respectively to segments 702B and K. A short vertical segment 702F interconnects segments 702E and G. A crossover is located near corner 704 and includes a short conductor 702N disposed on the exterior surface of base 102 and conductive throughholes 702M and P which join segments 702J, N, and H. In the alternate, the crossover could be constructed as a multilayer printed circuit pattern disposed on the interior surface of base 102. The crossover at 704 is necessary when the overall length of antenna 702 is substantially less than one half a wave length. Segments 702E, F and G have not been extended to corner 706 to allow for printed circuit interconnections (such as 116 of FIG. 1) to interconnect printed circuit patterns on the interior surfaces of base 102 and cover 104. If no printed circuit pattern is disposed on cover 104, however, segments 702E, F and G may be extended towards corner 706. The triple-fold antenna has four planes which are defined respectively by segments 702B and K, segments 702C and J, segments 702H and D, and segments 702G and E. All four planes lie substantially perpendicular to the interior surface of base 102.

Figure 9:
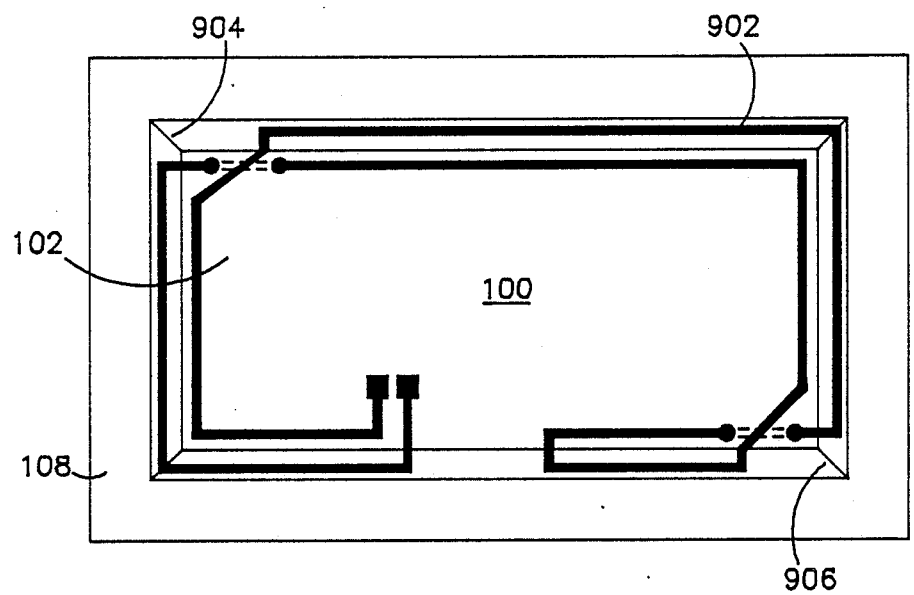
FIG. 9 is a plan view of an ultra thin radio housing with a printed circuit, triple-fold, double-crossover, loop antenna disposed on the base and peripheral wall.

In FIG. 9, a triple-fold, double crossover, printed circuit loop antenna 902 is illustrated. Referring to this figure, antenna 902 is similar in design and construction to antenna 702 of FIGS. 7 and 8, however, antenna 902 includes two crossovers in corners 904 and 906 instead of only one. Antenna 902 also has four planes which all lie substantially perpendicular to the interior surface of base 102.

Figure 10:
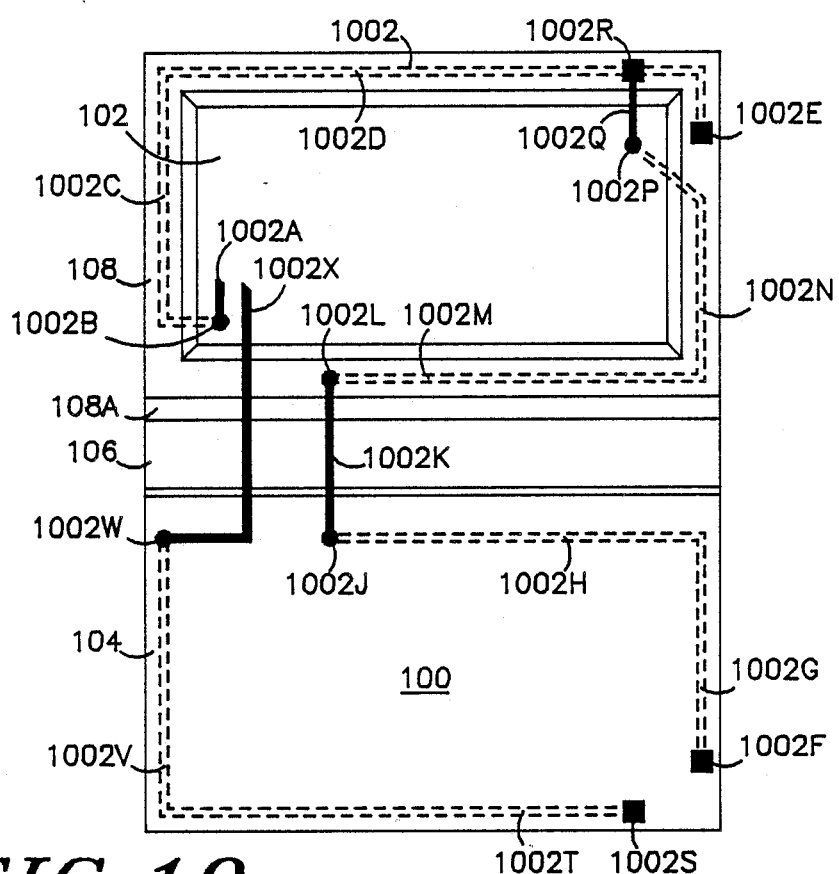
FIG. 10 is a plan view of an ultra thin radio housing with a printed circuit, triple-fold, single-crossover, loop antenna disposed on the exterior surfaces of the base and cover.

In FIG. 10, another embodiment of a triplefold, single crossover, printed circuit loop antenna is illustrated. Referring to this figure, antenna 1002 is similar to antenna 702 of FIGS. 7 and 8, except that the individual segments of the antenna (1002C-D, 1002G-H, 1002M-N and 1002T-V) are disposed on the exterior surfaces of base 102 and cover 104 to provide an increased cross-sectional area. Conductive through-holes 1002B and W provide connections from transmission line conductors 1002A and X to antenna segments 1002C and V, respectively. Conductor 1002K and conductive through-holes 1002J and L provide a connection between antenna segments 1002H and M. A short conductor 1002Q and a conductive through-hole 1002P connects antenna segment 1002N to soldering pad 1002R, which is disposed on the upper surface of peripheral wall 108. Conductive through-holes/soldering pads 1002E, F and S are similar in design and construction to through-holes/pads 602E and F of FIG. 6. When housing 100 is fully assembled, pad 1002E is soldered to pad 1002F and pad 1002R is soldered to pad 1002S. Thus, when the housing is fully assembled, antenna segment 1002D is connected to segment 1002G, and segment 1002N is connected to 1002T. Antenna 1002 has four planes which all lie substantially perpendicular to the interior surface of base 102.

We claim as our invention:

1. An ultra-thin radio housing integral antenna, comprising in combination:
    a thin base having upper and lower surfaces and including a peripheral wall attached to said upper surface and extending substantially around the perimeter of said base, the peripheral wall includes a portion sloped at an acute angle relative to the base; and
    a loop antenna disposed at least partially on said peripheral wall sloped section of said base.

2. The housing of claim 1, wherein:
    said loop antenna includes a printed circuit pattern; and
    the plane of said loop antenna lies substantially parallel to said flat surface of said base.

3. The housing of claim 1, wherein:
    said loop antenna includes a printed circuit pattern and a substantially ninety degree bend; and a plane of said loop antenna lies substantially perpendicular to said flat surface of said base.

4. The housing of claim 1, wherein:
    said loop antenna includes a printed circuit pattern, three substantially ninety degree bends, and a crossover; and
    a plane of said loop antenna lies substantially perpendicular to said flat surface of said base.

5. A radio housing with integral antenna, comprising in combination:
    an integrally molded housing including, a base having upper and lower opposed surfaces, a cover, and a hinge joining said cover to said base; and
    a printed circuit loop antenna pattern having a first portion disposed on said base, a second portion disposed on said cover, and a third portion disposed on said hinge.

6. The radio housing of claim 5, wherein the plane of said loop antenna lies substantially parallel to said flat surface of said base.

7. The radio housing of claim 5, wherein the plane said loop antenna lies substantially parallel to said flat surface of said base, and said antenna includes a plurality of turns, one of said turns disposed on said base and another of said turns being disposed on said cover.

8. The radio housing of claim 5, wherein:
    said loop antenna includes a substantially ninety degree bend; and
    a plane of said loop antenna lies substantially perpendicular to said flat surface of said base.

9. The radio housing of claim 5, wherein:
    said loop antenna includes three substantially ninety degree bends and a crossover; and
    a plane of said loop antenna lies substantially perpendicular to said flat surface of said base.

10. A radio housing with integral antenna, comprising in combination:
    an integrally molded thermo-plastic housing having a base a cover and a living hinge interconnecting the base and the cover; and
    a solderable loop antenna including a first portion vacuum deposited onto said base, a second portion vacuum deposited onto said cover, and a third portion vacuum deposited onto said hinge.

11. The radio housing of claim 10, wherein:
    said base includes a flat surface; and
    the plane of said loop antenna lies substantially parallel to said flat surface.

12. The radio housing of claim 10, wherein:
    said base includes a flat surface;
    said loop antenna includes a substantially ninety degree bend; and
    a plane of said loop antenna lies substantially perpendicular to said flat surface.

13. The radio housing of claim 10, wherein:
    said base includes a flat surface;
    said loop antenna includes three substantially ninety degree bends and a crossover; and
    a plane of said loop antenna lies substantially perpendicular to said flat surface of said base.

* * * * *